(12) United States Patent
Kuehlmann et al.

(10) Patent No.: US 7,296,246 B1
(45) Date of Patent: Nov. 13, 2007

(54) MULTI-DOMAIN CLOCK SKEW SCHEDULING

(75) Inventors: Andreas Kuehlmann, Berkeley, CA (US); Kaushik Ravindran, Berkeley, CA (US); Ellen Sentovich, Oakland, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 249 days.

(21) Appl. No.: 10/701,911

(22) Filed: Nov. 5, 2003

(51) Int. Cl.
*G06F 17/50* (2006.01)
(52) U.S. Cl. .............................. 716/2; 716/6
(58) Field of Classification Search ............ 716/6
See application file for complete search history.

(56) References Cited

U.S. PATENT DOCUMENTS 6,550,045 B1 * 4/2003 Lu et al. ................... 716/6
6,873,187 B1 * 3/2005 Andrews et al. ............ 326/93

OTHER PUBLICATIONS

Sapatnekar, S.S. and Deokar, R. B. ; "Utilizing the Retiming-skew Equivalent in a Practical Algorithm for Retiming Large Circuits", Computer-Aided Design of Integrated Circuits and Systems, IEEE Transaction vol. 15, issue 10, pp. 1237-1248.*
Nakamura, K.; Maruoka, S.; Kimura, S.; Watanbe, K. ; "Multi-Clock Path Analysis Using Propositional Satisfiability", Design Automation Conference, 2000. Proceedings of the ASP-DAC 2000. Asia and South Pacific Jan. 25-28, 2000 pp. 81-86.*
Dasdan A.,Sandy S. Irani, Rajesh K. Gupta; "Efficient Algorithms for Optimum Cycle Mean and Optimum Cost to Time Ratio Problems", Jun. 1999, Proceedings of the 36th ACM/IEEE conference on Design Automation.*
Deokar, R.B.; Sapatnekar, S.S.; "A Graph-theoretic Approach to Clock Skew Optimization" Circuit and Systems, 1994. ISCAS'94, 1994 IEEE International Symposium on vol. 1, May 30-Jun. 2, 1994 pp. 407-410 vol. 1.*
Ravindran K., Kuehlmann A., Sentovich E., "Multi-Domain Clock Skew Scheduling", Nov. 2003 Proceedings of the 2003 IEEE/ACM international conference on Computer-aid design.*
C. Albrecht et al., "Cycle Time and Slack Optimization for VLSI-Chips," 1999 IEEE, pp. 232-238.*
J.P.Fishburn et al., "Clock Skew Optimization," IEEE Transactions on Computers, vol. 39, No. 7, Jul. 1990, pp. 945-951.*
K.Kurokawa et al., "A Practical Clock Tree Synthesis for Semi-Synchronous Circuits," IEICE Trans. Fundamentals, vol. E84-A, No. 11, Nov. 2001, pp. 2705-2713.*

(Continued)

*Primary Examiner*—Leigh M. Garbowski
(74) *Attorney, Agent, or Firm*—Reed Smith, LLP

(57) ABSTRACT

The present invention provides a process for constrained clock skew scheduling which computes for a given number of clocking domains the optimal phase shifts for the domains and the assignment of the individual registers to the domains. For the within domain latency values, the algorithm can assume a zero-skew clock delivery or apply a user-provided upper bound. Experiments have demonstrated that a constrained clock skew schedule using a few clocking domains combined with small within-domain latency can reliably implement the full sequential optimization potential to date only possible with an unconstrained clock schedule.

38 Claims, 6 Drawing Sheets

OTHER PUBLICATIONS

M.W.Moskewicz et al., "Chaff: Engineering an Efficient SAT Solver," DAC 2001, pp. 530-535.*

E.M.Sentovich et al., "Sequential Circuit Design Using Synthesis and Optimization," 1992 IEEE, pp. 328-333.*

D.P.Singh et al., "Constrained Clock Shifting for Field Programmable Gate Arrays," FPGA 2002, 6 pages.*

N.E.Young et al., "Faster Parametric Shortest Path and Minimum Balance Algorithms," NETWORKS, vol. 21:2, Mar. 1991, 17 pages.*

* cited by examiner

Example for unconstrained clock skew scheduling: (1A) circuit structure with gate delays, (1B) initial timing graph for $T_{cycle}=8$, (1C-1E) timing graphs at several iterations leading to a critical cycle at $T_{cycle}=6$

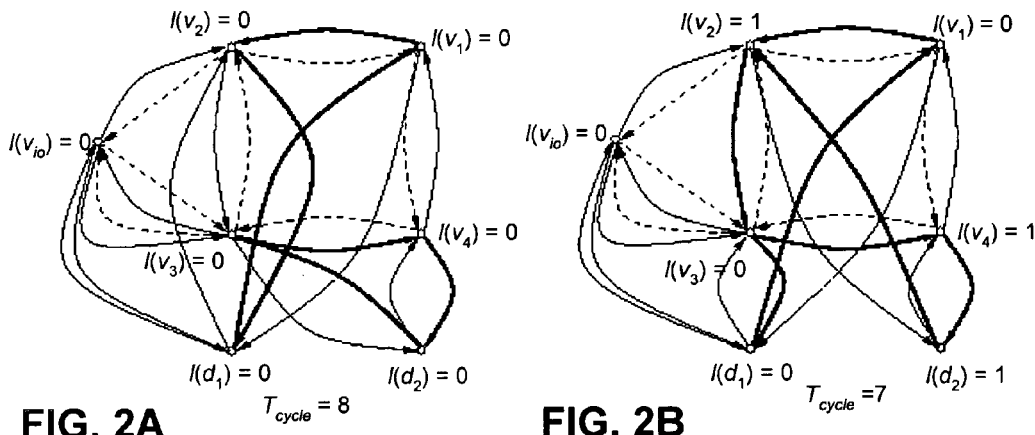
Two register-domain assignments for the circuit from Fig. 1 optimized for two clocking domains: (a) 1. configuration: $\{x(v_1, d_1) = x(v_2,d_1) = x(v_{io},d_1) = 1, x(v_3,d_2) = x(v_4,d_2)=1\}$; Critical cycles:
$(d_1,v_1,v_2), (d_2,v_3,v_4)$; $T_{cycle} = 8$, (b) 2. configuration: $\{x(v_1, d_1) = x(v_3,d_1) = x(v_{io},d_1) = 1, x(v_2,d_2) = x(v_4,d_2)=1\}$; Critical cycles: $(d_1,v_1,v_2,v_3), (d_2,v_2,v_3,v_4)$; $T_{cycle} = 7$.

For example partial ordering heuristic may over-constrain the solution space and thus lead to a suboptimal schedule and cycle period.

| Design | # FF | # Edges | $T_{cycle}$ | $\delta=0\% \times T_{cycle}^{1.0}$ | | $\delta=5\% \times T_{cycle}^{1.0}$ | | | | $\delta=10\% \times T_{cycle}^{1.0}$ | | |
|---|---|---|---|---|---|---|---|---|---|---|---|---|
| | | | | $T_{cycle}^{1.0}$ | $T_{cycle}^{2.0}$ | $T_{cycle}^{1.5}$ | $T_{cycle}^{1.0}$ | $T_{cycle}^{1.5}$ | $T_{cycle}^{2.0}$ | $T_{cycle}^{1.0}$ | $T_{cycle}^{1.5}$ | $T_{cycle}^{2.0}$ |
| s1196 | 19 | 365 | 22.28 | 22.28 | 22.28 | 22.28 | 22.28 | 22.28 | 22.28 | 22.28 | 22.28 | 22.28 |
| s1423 | 76 | 2235 | 73.13 | 79.04 | 75.35 | 73.82 | 75.08 | 73.13 | 73.13 | 73.13 | 73.13 | 73.13 |
| s298 | 16 | 86 | 10.79 | 13.65 | 11.36 | 10.79 | 12.46 | 10.79 | 10.79 | 11.75 | 10.79 | 10.79 |
| s420 | 18 | 146 | 21.13 | 22.64 | 21.13 | 21.13 | 21.13 | 21.13 | 21.13 | 21.13 | 21.13 | 21.13 |
| s526 | 23 | 167 | 11.22 | 11.48 | 11.79 | 11.22 | 12.81 | 11.22 | 11.22 | 12.13 | 11.22 | 11.22 |
| s641 | 21 | 486 | 29.51 | 29.96 | 29.51 | 29.51 | 29.51 | 29.51 | 29.51 | 29.51 | 29.51 | 29.51 |
| s832 | 7 | 213 | 16.22 | 16.22 | 16.22 | 16.22 | 16.22 | 16.22 | 16.22 | 16.22 | 16.22 | 16.22 |
| s953 | 8 | 94 | 15.36 | 17.31 | 15.77 | 15.36 | 16.48 | 15.36 | 15.36 | 15.59 | 15.36 | 15.36 |
| s1238 | 19 | 365 | 24.33 | 26.15 | 24.36 | 24.33 | 24.84 | 24.33 | 24.33 | 24.33 | 24.33 | 24.33 |
| s1488 | 8 | 266 | 23.18 | 23.58 | 23.18 | 23.18 | 23.18 | 23.18 | 23.18 | 23.18 | 23.18 | 23.18 |
| s208 | 10 | 70 | 9.91 | 10.84 | 9.91 | 9.91 | 10.30 | 9.91 | 9.91 | 9.91 | 9.91 | 9.91 |
| s344 | 17 | 121 | 13.14 | 15.57 | 14.32 | 13.19 | 14.79 | 13.54 | 13.14 | 14.16 | 13.14 | 13.14 |
| s382 | 23 | 175 | 9.63 | 14.06 | 11.55 | 9.77 | 13.36 | 10.77 | 9.63 | 12.64 | 10.01 | 9.63 |
| s386 | 8 | 129 | 9.60 | 10.56 | 9.97 | 9.64 | 10.03 | 9.63 | 9.60 | 9.74 | 9.60 | 9.60 |
| s444 | 23 | 175 | 8.10 | 13.92 | 10.84 | 9.53 | 13.22 | 10.14 | 8.18 | 11.53 | 9.45 | 8.15 |
| s526n | 23 | 167 | 11.31 | 13.57 | 11.91 | 11.31 | 12.89 | 11.31 | 11.31 | 12.21 | 11.31 | 11.31 |
| s713 | 21 | 486 | 30.58 | 30.58 | 30.58 | 30.58 | 30.58 | 30.58 | 30.58 | 30.58 | 30.58 | 30.58 |
| s838 | 34 | 298 | 44.66 | 45.59 | 44.66 | 44.66 | 44.66 | 44.66 | 44.66 | 44.66 | 44.66 | 44.66 |
| s1494 | 8 | 266 | 23.83 | 24.71 | 23.83 | 23.83 | 23.85 | 23.83 | 23.83 | 23.85 | 23.85 | 23.83 |
| s27 | 5 | 21 | 5.06 | 6.58 | 5.75 | 5.06 | 6.15 | 5.42 | 5.06 | 5.92 | 5.09 | 5.06 |
| s349 | 17 | 121 | 13.51 | 15.89 | 14.72 | 13.60 | 15.09 | 13.93 | 13.51 | 14.51 | 13.51 | 13.51 |
| s400 | 23 | 175 | 9.89 | 14.59 | 11.62 | 10.15 | 13.84 | 10.89 | 9.89 | 13.13 | 10.16 | 9.89 |
| s510 | 8 | 103 | 14.29 | 14.29 | 14.29 | 14.29 | 14.29 | 14.29 | 14.29 | 14.29 | 14.29 | 14.29 |
| s3378 | 165 | 2180 | 22.89 | 28.84 | 25.93 | 23.17 | 27.40 | 24.21 | 22.89 | 25.96 | 22.89 | 22.88 |
| s3820 | 7 | 213 | 16.74 | 16.74 | 16.74 | 16.74 | 16.74 | 16.74 | 16.74 | 16.74 | 16.74 | 16.74 |
| s9234 | 140 | 2226 | 33.77 | 34.75 | 33.96 | 33.77 | 33.77 | 33.77 | 33.77 | 33.77 | 33.77 | 33.77 |
| s13207 | 471 | 3883 | 53.36 | 57.35 | 55.13 | 53.46 | 54.48 | 53.36 | 53.36 | 53.36 | 53.36 | 53.36 |
| s15850 | 565 | 16375 | 85.27 | 94.38 | 91.24 | 88.76 | 93.44 | 87.04 | 85.27 | 88.54 | 85.27 | 85.27 |
| s35932 | 1442 | 6128 | 286.32 | 289.47 | 286.32 | 286.32 | 286.32 | 286.32 | 286.32 | 286.32 | 286.32 | 286.32 |
| s38584 | 1451 | 17900 | 286.62 | 288.60 | 287.04 | 286.62 | 286.62 | 286.62 | 286.62 | 286.62 | 286.62 | 286.62 |
| s38417 | 1463 | 31980 | 86.19 | 87.76 | 86.19 | 86.19 | 86.19 | 86.19 | 86.19 | 86.19 | 86.19 | 86.19 |

Results of multiple-domain clock skew optimization on ISCAS89 sequential benchmark circuits

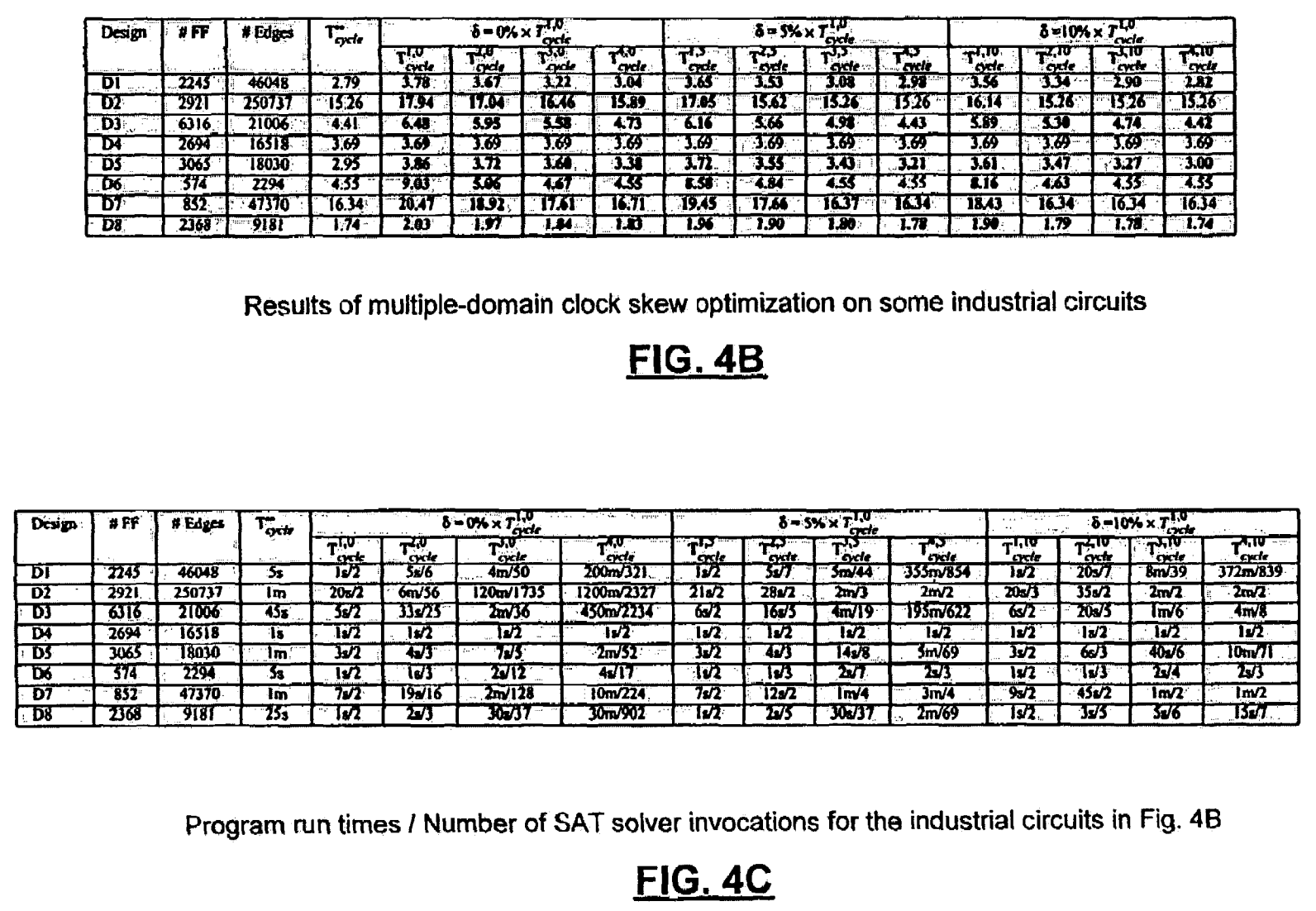

Results of multiple-domain clock skew optimization on some industrial circuits

FIG. 4C

Program run times / Number of SAT solver invocations for the industrial circuits in Fig. 4B Graphical tracking of the algorithm's progress over time for seven industrial designs optmized for four clocking domains and zero within-domain latency. The dotted, solid, and dashed segments denote phases 1, 2, and 3, respectively of the process defined by the pseudo code in Table 7.

MULTI-DOMAIN CLOCK SKEW SCHEDULING

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

Field of Invention

Discussion of Background

Clock skew scheduling, often denoted as "cycle stealing", computes a set of individual delays for the clock signals of the registers and latches of synchronous circuits to minimize the clock period. The schedule globally tunes the latching of the state holding elements such that the delays of their incoming and outgoing paths are maximally balanced. The computed intentional differences in the clock arrival times, also referred to as "useful skew", are then implemented by designing dedicated delays into the clock distribution. In practice, a clock schedule with a large set of arbitrary delays cannot be realized in a reliable manner. This is because the implementation of dedicated delays using additional buffers and interconnections is highly susceptible to within-die variations of process parameters. As a consequence, the practically applicable maximum differences for the clock arrival times are typically restricted to less than 10% of the clock period, which limits the optimization potential of clock skew scheduling.

In current design methodologies, the specification of multiple clocking domains is mostly done manually. Multiple clocking domains are routinely applied in designs to realize several clocking frequencies and also to address specific timing requirements. For example, a special clocking domain that delivers a phase-shifted clock signal to the registers close to the chip inputs and outputs is regularly used to achieve timing closure for ports with extreme constraints on their arrival and required times.

SUMMARY OF THE INVENTION

The present inventors have realized that application of general clock skew scheduling is practically limited due to the difficulties in implementing a wide spectrum of dedicated clock delays in a reliable manner, which results in a significant limitation of the optimization potential of a circuit design. In the present invention, the application of multiple clocking domains with dedicated phase shifts are implemented by reliable design structures that overcome these limitations and substantially increase the implementable optimization potential of clock adjustments.

The present inventors have also realized that a multi-domain approach can be used to realize larger clock latency variations for all registers (e.g., registers, latches, flip-flops, memory elements, etc.). In combination with a within-domain clock skew scheduling process, the present invention is an aggressive sequential optimization. The present invention is implemented, for example, with large phase shifts between clocking domains by using dedicated, possibly expensive, circuit components such as "structured clock buffers," adjustments to the PLL circuitry, or by deriving the set of phase-shifted domains from a higher frequency clock using different tapping points of a shift register.

In describing the present invention, the term clock latency of a register is used to denote its clock arrival time relative to a common origin of time. Note that the origin can be chosen arbitrarily, different origins simply correspond to different offsets added to all register latencies. Clock skew refers to the relative difference of the clock latencies of registers. The term clock phase shift of a domain denotes an offset of the latency common to all registers of that domain. The within-domain latency is defined as the difference between the clock latency of a register and the phase shift of its domain. Thus a zero within-domain latency means that all register latencies of a domain are equal to the phase shift of the domain. For example, the present invention includes applying useful skew to each domain as one way of computing within domain latency. The present invention goes further and limits within domain latency so that the result is implementable within constraints of the chip to be implemented.

Roughly described, the present invention is a process for constrained clock skew scheduling that determines, for a user-given number of clocking domains, optimal phase shifts for domain clocks and an assignment of circuit registers to the domains. For the clock distribution within a domain, the process can assume a zero-skew clock delivery or apply a user-provided upper bound for the within-domain latency.

The present invention is based on a branch-and-bound search for the assignment of registers to clocking domain[s]. In one embodiment, a satisfiability (SAT) solver based on a problem encoding in conjunctive normal form (CNF) is utilized to efficiently drive the search and compactly record parts of the solution space that are guaranteed to contain no solutions better than the current one. The combination of a modern SAT solver with an underlying orthogonal optimization problem provides a powerful mechanism for a hybrid search that also has significant potential for other applications in many domains.

For simplicity, the present invention is described based on circuits which have initially a single clocking domain and include registers that are triggered at a same clock edge. However, all presented concepts and features of the invention may, upon review of the present disclosure by the ordinarily skilled artisan, be readily extended to more general cases including circuits which have initially multiple, or uncorrelated, clocking domains and also include level-sensitive latches.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B are multi-domain timing graphs that illustrate embodiments of the present invention;

FIGS. 4A-4C are results from operations of the present invention; and

DESCRIPTION OF THE PREFERRED EMBODIMENTS

The present invention is now described first by looking at unconstrained clock skew scheduling which is then extended to the constrained case.

Given a sequential circuit, the objective of generic clock skew scheduling is to determine an assignment of latencies to registers in order to minimize the clock period, while avoiding clocking hazards. Let $G=(V,E_{setup},E_{hold})$ denote the timing graph for a sequential circuit. The set of vertices V corresponds to the registers in the circuit and includes a single vertex for all circuit ports. The sets $E_{setup} \subseteq V \times V$ and $E_{hold} \subseteq V \times V$ denote the setup edges and hold edges, respectively. $E_{setup}$ contains for each set of combinational circuit paths between registers (or a port) u and v a directed edge $e=(u,v)$ with weight $w(u,v)=T_{cyle}-d_{max}(u,v)-d_{setup}(v)$, where $d_{max}(u,v)$ represents the longest combinational delay among all paths between u and v, $d_{setup}(v)$ denotes the setup time at v, and $T_{cycle}$ is the cycle period. $E_{hold}$ consists of a set of reversed edges $e_{hold}=(v,u)$ with weight $w(v,u)=d_{min}(u,v)-d_{hold}(v)$, where $d_{min}(u,v)$ is the shortest combinational delay among all paths between u and v and $d_{hold}(v)$ denotes the hold time at v. By construction, G is strongly connected and contains at least one setup edge. Assume that all weights of hold edges are nonnegative, i.e., $\forall e \in E_{hold}: w(e) \geq 0$. This restriction simplifies the presentation, however, all algorithms can be extended easily for a relaxed condition that just prohibits negative hold time cycles.

Let $l: V \rightarrow RR$ assign a clock latency to each register and $E=E_{setup} \cup E_{hold}$. An optimal clock skew schedule $l(v), v \in V$ is to be determined such that:

$$\forall (u,v) \in E: l(v) - l(u) + w(u,v) \geq 0 \quad (1)$$

$$T_{cycle} \rightarrow min$$

Figure 1A:
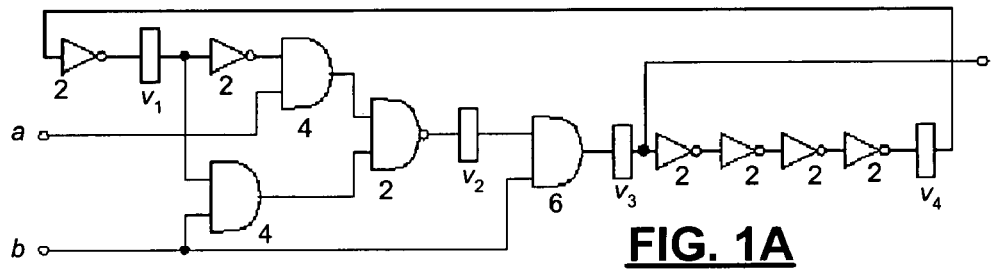
FIG. 1A is an example circuit for illustrating an adaptation of Burns' algorithm used in the embodiments of the present invention.
Figure 1B:
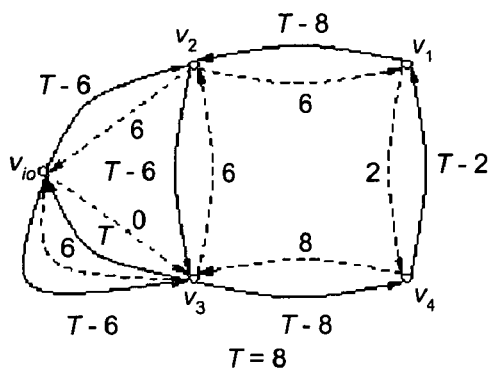
FIGS. 1B-1E provide an example sequence of timing graphs according to embodiments of the present invention.

The computed values l give for each register the additional delay (or advance if l<0) of its clock signal such that the circuit can be clocked with the minimum cycle period $T_{cycle}$. Note that condition (1) ensures that the setup and hold constraints are satisfied as modeled by the edges $E_{setup}$ and $E_{hold}$, respectively. FIG. 1A gives an example of a circuit and FIGS. 1B-1E provide timing graphs corresponding to the example circuit. The setup and hold times of registers and ports are assumed to be 0. The solid and dashed arcs correspond to the setup edges $E_{setup}$ and hold edges $E_{hold}$, respectively.

Computation of the optimal clock schedule is closely related to detection of the critical cycle which is the structural cycle with the maximum value for total_delay/num_registers (ignoring hold edges). Detecting the critical cycle is equivalent to computing the maximum mean cycle (MMC) of a weighted cyclic graph. However, the present invention works better with a faster MMC and adapts Burns' work to provide a fast MMC. (See S. M. Burns, "Performance Analysis and Optimization of Asynchronous Circuits," Ph.D. Thesis, California Institute of Technology, Pasadena, Calif., December 1991).

Table 1 provides a pseudo code listing for an adaptation of Burns' iterative MMC computation for the given problem. The basic idea is to iteratively decrease $T_{cycle}$ and compute the corresponding clock schedule l at each step until a critical cycle is discovered. First, the schedule is initialized with all latencies set to 0 and $T_{cycle}$ to the maximum edge delay plus the setup time. At each iteration, the set of edges critical under the current schedule form the critical sub-graph G' (lines 4-6). If G' contains a cycle with at least one setup edge, the critical cycle has been found and the schedule l and best $T_{cycle}$ are returned (line 8). Otherwise, a conservative decrement θ for the cycle period is computed based on a one-step look ahead from the ends of the critical subgraph (lines 12-17). This calculation and the fast update of the schedule l uses the longest distance Δ(v) of vertex v from any root of G' (line 10). Note that G' may contain cycles formed by hold edges only. However, the increments of the Δ values along such cycles are 0 and thus convergence is guaranteed. At the end of each iteration the schedule l and $T_{cycle}$ are updated (lines 18, 19). Note that when the UNCONSTRAINEDSKEWSCHEDULING process terminates, the sum of the edge weights w of the critical cycles is equal to zero.

TABLE 1

UNCONSTRAINEDSKEWSCHEDULING (G)

1  foreach v ∈ V:l(v) = 0
2  $T_{cycle}$ = max {$d_{max}$ (u, v) + $d_{setup}$(v)|(u, v) ∈ $E_{setup}$}
3  while (true)
   // compute critical edges of G yielding critical graph G'
4  $E_{setup}'$ = {(u, v)|(u, v) ∈ $E_{setup}$, w(u, v) + l(v) − l(u) = 0}
5  $E_{hold}'$ = {(u, v)|(u, v) ∈ $E_{hold}$  w(u, v) + l(v) − l(u) = 0}
6  G' = (V, $E_{setup}'$, $E_{hold}'$)
7  if (G' contains cycle with at least one edge e ∈ $E_{setup}'$)
8  return l, $T_{cycle}$  // critical cycle found
   // compute for each vertex longest distance Δ from roots in G'
9  repeat foreach v ∈ V until no change
10  $$\Delta(v) = \begin{cases} 0 & : \text{if v is root of } G' \\ \max\{\{\Delta(u) + 1 \mid (u, v) \in E'_{setup}\}, \\ \{\Delta(u) \mid (u, v) \in E'_{hold}\}\} & : \text{otherwise} \end{cases}$$
   // compute conservation value for reducing $T_{cycle}$
11  θ = ∞
12  foreach (u, v) ∈ $E_{setup}$
13  if (Δ(u) − Δ(v) + 1 > 0)
14  $$\theta = \min\left\{\theta, \frac{w(u, v) - l(u) + l(v)}{\Delta(u) - \Delta(v) + 1}\right\}$$
15  foreach (u, v) ∈ $E_{hold}$
16  if (Δ(u) − Δ(v) > 0)
17  $$\theta = \min\left\{\theta, \frac{w(u, v) - l(u) + l(v)}{\Delta(u) - \Delta(v)}\right\}$$
   // update values for l and $T_{cycle}$
18  foreach v ∈ V:l(v) = l(v) + θ · Δ(v)
19  $T_{cycle}$ = $T_{cycle}$ − θ

Figure 1C:
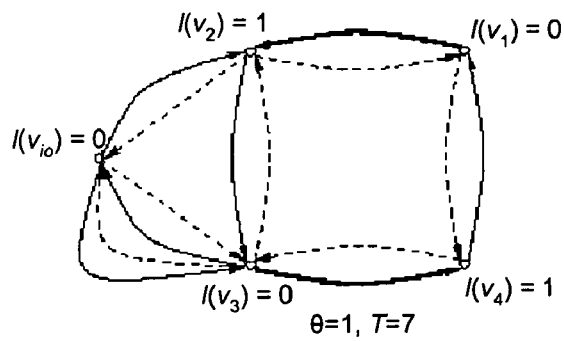
Figure 1D:
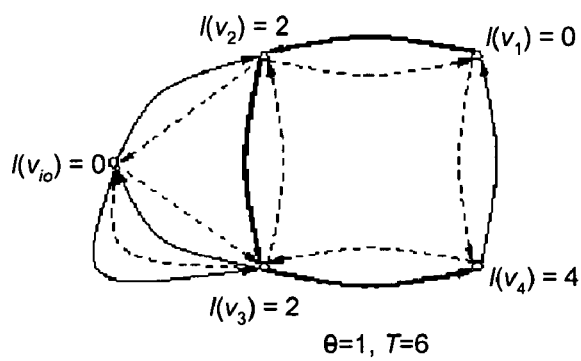
Figure 1E:
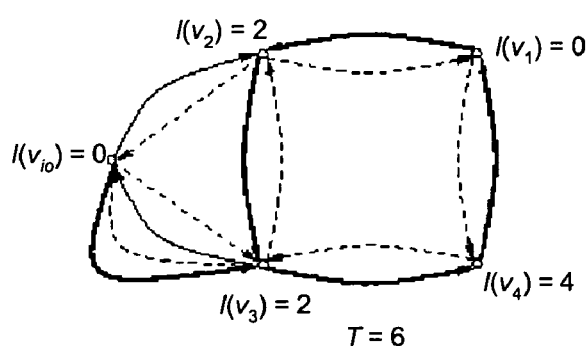

For the given example in FIG. 1A, the first iteration of Algorithm 1 results in the graph depicted in FIG. 1C (an initial timing graph for the circuit of FIG. 1A with $T_{cycle}$=8) where the two critical edges ($v_1,v_2$) and ($v_3,v_4$) with delays equal to the current clock period are highlighted. Now, $\Delta(v_2)=\Delta(v_4)=1$, and $\Delta(v_1)=\Delta(v_3)=0$. The edge ($v_2,v_3$) determines θ=1 as the maximum amount by which $T_{cycle}$ can be reduced. Thus $T_{cycle}$=7 at the end of the iteration and the vertex latencies are as shown in FIG. 1E. The following iteration (see FIG. 1D) adds one new critical edge, and θ=1 results in $T_{cyle}$=6. The next iteration (FIG. 1E) finds a critical cycle and returns $T_{cycle}$=6 as the best possible cycle time.

The following section describes multi-domain or constrained clock skew scheduling. Multi-domain clock skew scheduling of a timing graph $G=(V,E_{setup},E_{hold})$ for a small number of domains imposes additional constraints on the values for clock latencies. For a given number of clocking domains n and a maximum permissible within-domain latency $\delta$, all clock latencies need to fit into n value ranges $$(l(d_1),l(d_1)+\delta)$$

$$(l(d_n),l(d_n)+\delta)$$

where $l(d_i)$ denotes the phase shift of domain i. The objective of multi-domain clock skew scheduling is to determine domain phase shifts $l(d)$ and register latencies $l(v)$ that satisfy the above range constraints and minimize the period $T_{cycle}$.

For a formal model, the definition of the timing graph is extended by introducing a set of domain vertices and conditional edges between registers and domains. Let $G=(V,D,E_{setup},E_{hold},E_{cond})$ denote a multi-domain timing graph where the set of vertices V and sets of edges $E_{setup}$ and $E_{hold}$ have the same definition as before. D represents a set of vertices that correspond to the clocking domains and $E_{cond}=(V\times D)\cup(D\times V)$ are conditional edges associating the registers to the domains. For each pair $v\in V, d\in D$ two locking edges (v,d) and (d,v) are included in $E_{cond}$ with the conditional weights w(v,d) and w(d,v), respectively. Using a set of Boolean variables $x(v,d)\in\{0,1\}$ the weights are defined as follows:

$$w(v, d) = \begin{cases} \delta & \text{:if } x(v, d) = 1 \\ \infty & \text{:otherwise} \end{cases}$$

$$w(d, v) = \begin{cases} 0 & \text{:if } x(v, d) = 1 \\ \infty & \text{:otherwise} \end{cases}$$

The Boolean attribute x(v,d) is true if register v is assigned to domain d. Let l(d) be the phase shift of domain d. The conditional weights on the edges of $E_{cond}$ ensure that the latency l(v) of register v is bound by $l(d)\leq l(v)\leq l(d)+\delta$ if v is assigned to d.

Let $E=E_{setup}\cup E_{hold}\cup E_{cond}$. For constrained clock skew scheduling, a set of register clock latencies $l(v), v\in V$, domain phase shifts $l(d), d\in D$, and assignments of registers to domains x(v,d) are determined such that:

$$\forall (u,v)\in E: l(v)-l(u)+w(u,v)\geq 0 \qquad (2)$$

$$\forall v \in V : \sum_{\forall d} x(v, d) = 1 \qquad (3)$$

$$T_{cycle} \to \min$$

Similar to the unconstrained case, constraint (2) ensures that all setup and hold time constraints are satisfied and furthermore that all registers assigned to a domain do not exceed the specified maximum within-domain latency. Condition (3) specifies that each register has to be assigned to exactly one domain.

The problem formulation for constrained clock skew scheduling discussed above establishes a Mixed Integer Linear Program (MILP). Unfortunately, the size of practical problem instances involving thousands of registers makes their solution difficult, if not intractable, for generic MILP solvers.

The present invention provides a process that efficiently solves the constrained clock skew scheduling problem for a small number of domains. The present invention provides a hybrid approach combining a CNF-based SAT solver with a modified version of the scheduling algorithm used in the unconstrained case. The SAT solver is used for enumerating the assignments of registers to domains based on the presented encoding with the Boolean variables x. Example encodings are also presented. Boolean constraints are applied to restrict the search to valid assignments according to condition (3) and to incrementally record parts of the solution space that do not contain solutions that are better than the best found thus far. This recording is done by adding conflict clauses to the SAT problem which prevent the solver from revisiting symmetric parts of the solution space.

Example pseudo code of an embodiment of the present invention is shown in Table 2.

TABLE 2

CONSTRAINEDSKEWSCHEDULING (G)

| | |
|---|---|
| 1 | $T_{cycle} = \max\{d_{max}(u,v) + d_{setup}(v)|(u,v) \in E_{setup}\}$ |
| 2 | $\phi$ = empty CNF formula with variables $\{x(v,d)|v \in V, d \in D\}$ |
| 3 | INITIALCONSTRAINTS (G,$\phi$) |
| 4 | while (true) |
| 5 |    $x_{SAT}$ = SATSOLVE ($\phi$) |
| 6 |    if ($x_{SAT}$ = UNSAT) |
| 7 |       return l,$T_{cycle}$ |
| 8 |    if (G contains negative weighted cycle) |
| 9 |       NEGCYCLECONSTRAINTS (G,$T_{cycle}$,$\phi$,$x_{SAT}$) |
| 10 |    else |
| 11 |       l,$T_{cycle}$ = CONDITIONALSCHEDULE (G,$x_{SAT}$) |
| 12 |       TIGHTENINGCONSTRAINTS (G,$T_{cycle}$,$\phi$,$x_{SAT}$) |

After initialization on lines 1 and 2, an empty CNF formula $\phi$ is created with a set of variables for the registers and clocking domains. An initial set of Boolean constraints to $\phi$ that encode valid register-to-domain assignments and represent necessary conditions for the optimization problem are determined (e.g., procedure INTITALCONSTRAINTS). Next the SAT solver is called iteratively to find a complete satisfying assignment $x_{SAT}$ with respect to $\phi$. For each generated satisfying assignment, one of the following applies: (1) if the minimum possible period for the configuration is greater than the current best value for $T_{cycle}$, then this can be detected by a negative cycle in the graph configured by $x_{SAT}$, or (2) if there are no negative cycles, then $T_{cycle}$ can be further improved using Burns' type optimization process.

In the first case, the negative cycles are learned by, for example, adding corresponding CNF constraints to $\phi$ (e.g., procedure NEGCYCLECONSTRAINTS). In the second case a modified critical cycle analysis, an example of which is provided in the pseudo code of Table 3, is invoked to further improve/optimize $T_{cycle}$ until a tighter critical cycle is reached.

TABLE 3

CONDITIONALSCHEDULE (G, $x_{SAT}$)

| | |
|---|---|
| 1 | foreach $v \in V: l(v) = 0$ |
| 2 | $T_{cycle} = \max\{d_{max}(u, v) + d_{setup}(v) \mid (u, v) \in E_{setup}\}$ |
| 3 | while (true) |
| 4 |    $E_{setup}' = \{(u, v) \mid (u, v) \in E_{setup}, w(u, v) + l(v) - l(u) = 0\}$ |
| 5 |    $E_{hold}' = \{(u, v) \mid (u, v) \in E_{hold}, w(u, v) + l(v) - l(u) = 0\}$ |
| 6 |    $E_{cond}' = \{(u, v) \mid (u, v) \in E_{cond}, w(u, v) + l(v) - l(u) = 0\}$ |
| 7 |    $G' = (V, E_{setup}', E_{hold}', E_{cond}')$ |
| 8 |    if (G' contains cycle with at least one edge $e \in E_{setup}'$) |
| 9 |       r turn l, $T_{cycle}$ //critical cycle found |

TABLE 3-continued

CONDITIONALSCHEDULE (G, $x_{SAT}$)

10  repeat foreach $v \in V$ until no change

11  $\Delta(v) = \begin{cases} 0 & : \text{if } v \text{ is root of } G' \\ \max\{\{\Delta(u) + 1 \mid (u, v) \in E'_{setup}\}, \\ \{\Delta(u) \mid (u, v) \in E'_{hold} \cup E'_{cond}\}\} & : \text{otherwise} \end{cases}$ 12  $\theta = \infty$
13  foreach $(u, v) \in E_{setup}$
14  if $(\Delta(u) - \Delta(v) + 1 > 0)$ 15  $\theta = \min\left\{\theta, \frac{w(u, v) - l(u) + l(v)}{\Delta(u) - \Delta(v) + 1}\right\}$ 16  foreach $(u, v) \in E_{hold} \cup E_{cond}$
17  if $(\Delta(u) - \Delta(v) > 0)$ 18  $\theta = \min\left\{\theta, \frac{w(u, v) - l(u) + l(v)}{\Delta(u) - \Delta(v)}\right\}$ 19  foreach $v \in V: l(v) = l(v) + \theta \cdot \Delta(v)$
20  $T_{cycle} = T_{cycle} - \theta$ Following the optimization step, a set of new CNF constraints is added to $\phi$ (e.g., TIGHTENINGCONSTRAINTS) which encode the critical cycles in G and other conditions that are necessary for improving the solution.

The negative and critical cycle constraints jointly ensure that no configuration with previously encountered cycles is revisited. The iteration between the SAT solver and the critical cycle analysis is continued until no new solution can be found. At this point, the values for the last $T_{cycle}$ and l presents the optimal solution for the constrained clock skew scheduling problem.

Thus, the pseudo code of Table 2 provides the modified critical cycle analysis. An assignment to $x_{SAT}$ is used to "activate" conditional edges of $E_{cond}$, which are then treated in the same way as the edges of $E_{hold}$ from the Table 1 pseudo code.

To simplify the presentation of the algorithmic flow, register latencies are initialized to 0 and $T_{cycle}$ is set to the maximum combinational delay each time a process such as that illustrated by the pseudo code in Table 3 is invoked. This ensures a valid starting point for a Burns' type optimization process. Furthermore, procedure CONDITIONALSCHEDULE is only applied if G does not contain any negative cycle for the current $T_{cylce}$—thus it is guaranteed that a schedule with an equal or smaller value for $T_{cycle}$ can be found.

The detection of negative cycles on pseudo code line 8 of Table 2 and the computation of valid register latencies for the given best $T_{cycle}$ is combined using a single analysis run. This provides a good starting point for tightening the critical cycle and thus avoids unnecessary iterations of the optimization process.

In one embodiment, there are two sets of initial constraints for the SAT solver. The first set ensures that each register is assigned to exactly one domain. This is encoded by the following set of CNF clauses for all $v \in V$ and all $d_i, d_j \in D, i \neq j$:

$$\frac{\bigvee_{\forall d} x(v, d)}{\overline{x(v, d_i)} \vee \overline{x(v, d_j)}}$$

In one embodiment, to avoid visiting symmetric domain assignments, a corresponding set of CNF constraints are encoded that exclude these cases. In another embodiment, total ordering of the phase shifts of the individual domains is defined such that:

$$i < j \Rightarrow l(d_i) \leq l(d_j)$$

Preferably, the latter embodiment is used and which can be enforced by adding an edge $(d_i, d_{i+1})$ to the timing graph with weight $w(d_i, d_{i+1}) = 0$. Table 4 provides an example pseudo code listing for the generation of initial constraints.

TABLE 4

INITIALCONSTRAINTS (G,φ)

1  foreach $v \in V$
2  $\phi = \phi \cup \{\vee_{\forall d} x(v,d)\}$
3  foreach $d_i, d_j \in D, d_i \neq d_j$
4  $\phi = \phi \cup \{\overline{(x(v,d_i))} \vee \overline{x(v,d_j))}\}$
5  foreach $i: 0 < |D| - 1$
6  $E_{hold} = E_{hold} \cup \{(d_i, d_{i+1})\}$
7  $w(d_i, d_{i+1}) = 0$ Preferably, the edge weights are set to a slightly tighter value $w(d_i, d_{i+1}) = -\delta$ excluding "overlapping" solutions which can occur due to the within-domain latency of up to δ. However, using negative weights for the domain-to-domain edges requires special care for the initialization of the schedule l for a Burns' type optimization.

Table 5 is an example pseudo code listing for a NEGCYCLECONSTRAINTS procedure. The NEGCYCLECONSTRAINTS procedure is invoked if the graph currently configured cannot implement the best cycle time $T_{cycle}$ found thus far. This situation is detected by finding a cycle in G that contains at least one setup edge and has a non-positive cycle weight (e.g., line 9 of Table 2). Clearly, each cycle must contain at least one pair of "active" conditional edges from $E_{cond}$. This is because a negative cycle just consisting of edges $E_{setup} \cup E_{hold}$ constrains the minimum value of $T_{cycle}$ independently of the domain assignment and hence would have been detected earlier.

The negative or zero weighted cycles are encoded as CNF conflict clauses and added to φ. For example, if a cycle contains the two conditional edges $(v_1, d_1)$ and $(v_2, d_2)$, the clause $\overline{x(v_1, d_1)} \vee \overline{x(v_2, d_2)}$ is added which ensures that in the future both edges are not activated at the same time. Since the number of cycles is generally exponential, our implementation uses a greedy heuristic which encounters all cycles up to four conditional edges. Our experiments show that this scheme provides an efficient means to keep the number of learned clauses small and at the same time ensure quick convergence. Table 5 is an example pseudo code listing that summarizes the learning of negative cycle constraints.

TABLE 5

NEGCYCLECONSTRAINTS $(G,T_{cycle},\phi,x_{SAT})$ 1   foreach cycle $E_{cycle} \subseteq E_{setup} \cup E_{hold} \cup E_{cond}$
    with $\Sigma_{e \in E_{cycle}} w(e) \leq 0$ and at least one edge $e \in E_{setup}$
2   $\phi = \phi \cup \{(\vee_{\forall e \in E_{cycle} \cap E_{cond}} \overline{x(e)})\}$ If no negative cycles are encountered a conditional schedule process is performed (e.g., Table 3 pseudo code) to improve the clock period $T_{cycle}$ and calculate a corresponding schedule l. After this computation, a set of constraints encoding the zero-weight critical cycles are added which prevent revisiting a configuration with an identical critical cycle.

TABLE 6

TIGHTENINGCONSTRAINTS $(G,T_{cycle},\phi,x_{SAT})$

```
    // Critical cycle constraints
1   foreach cycle E_cycle ⊆ E_setup ∪ E_hold ∪ E_cond
        with Σ_{e∈E_cycle} w(e) = 0 and at least one edge e ∈ E_setup
2   φ = φ ∪ {(∨_{∀e∈E_cycle ∩ E_cond} x(e))}
    // Precedence constraints
3   foreach d_i : 0 < i < |D|
4       foreach d_j : i ≤ j < |D|
5           for ach u,v ∈ V,u ≠ v
6               w^P (u,v) = SHORTESTPATHLENGTH (G,u,v)
7               If (w^P (u,v) + (1 + i − j)•δ ≤ 0)
8                   φ = φ ∪ {(x(v,d_i) ∨ x(u,d_j))}
```

Table 6 provides an example pseudo code listing of a process that gives the general computation of the tightening constraints learned when $T_{cycle}$ is improved. The critical cycle constraints are computed on lines 1-2. Lines 3-8 determine the precedence constraints which arise due to the enforceable value ordering of phase shifts between individual domains, similar to the ones generated in procedure INITIALCONSTRAINTS. For example, if the weight of an edge $(u,v) \in E_{setup} \cup E_{hold}$ is less than or equal to 0, condition (2) in the MILP formulation implies $l(v) \geq l(u)$. Because of the assumed ordering of domains this inequality can be learned through the following set of clauses generated for all $d_i, d_j \in D: i < j$:

$\overline{x(v,d_i)} \vee \overline{x(u,d_j)}$

These clauses effectively capture the constraint that any satisfying configuration $x_{SAT}$ can only allow assignments $x(u,d_i)$ and $x(v,dj)$ where $i \leq j$. The condition can be applied more generally by including any path from u to v formed by edges of $E_{setup} \cup E_{hold}$ with negative path weight. When $T_{cycle}$ is decreased, all edges in $E_{setup}$ decrease in weight. The precedence constraint can then be implied on a subset of paths in $G=(V,E_{setup},E_{hold})$ whose weights become negative. Again, overlapping solutions can be avoided by tightening these constraints by the sum of the bounds on the within-domain latencies. For an efficient generation of precedence constraints, an incremental All-Pairs-Shortest-Path algorithm is used to update the shortest path delays between any pair of nodes in G whenever $T_{cycle}$ is improved.

FIGS. 2A and 2B show multi-domain timing graphs for two configurations for the example of FIG. 1A with two clocking domains and within-domain latency $\delta=0$. The minimum period with two domains ($T_{cycle}=7$) is achieved by the configuration in FIG. 2B. Note that with three domains the minimum clock period is 6, which is the same solution for the unconstrained case as derived in FIG. 1A. Indeed, the optimum clock period achieved in the unconstrained case provides a lower bound for the optimum period when the number of domains is constrained.

For the constrained clock skew scheduling example in FIGS. 2A and 2B, there are at most $|D|^{|V|}=2^5=32$ different configurations to explore in order to compute the smallest period with two domains. The key for efficiently pruning the search is based on the observation that the period of a particular configuration is limited only by the subset of the register-domain assignments that correspond to critical cycles in the timing graph. For example, after the SAT solver generates the configuration in FIG. 2A, other configurations are avoided with either the assignments $x(v_1,d_1)=x(v_2,d_1)=1$ or $x(v_3,d_2)=x(v_4,d_2)=1$, since the corresponding critical cycles always limit $T_{cycle}$ to 8. This is encoded by adding the following two CNF conflict clauses to $\phi$: $(\overline{x(v_1,d_1)} \vee \overline{x(v_2,d_1)})$ and $(\overline{x(v_3,d_2)} \vee \overline{x(v_4,d_2)})$.

When the configuration in FIG. 2B is visited, $T_{cycle}$ is updated to 7 and the corresponding critical cycles are learned. In this manner, the process continuously generates valid configurations, prunes the remaining search space by learning critical cycles, and improves $T_{cycle}$ until the SAT solver is unable to find another satisfying register-domain assignment.

The base process discussed herein works efficiently for larger circuits up to three clocking domains. However, in the case of more clocking domains, the exponential nature of the problem may cause long runtimes. Note that the search can be interrupted at any point; all encountered solutions are valid; thus the last one can serve as a suboptimal schedule.

Runtime can be reduced when the search is composed of the following three phases: (1) initial estimation of a good solution based on binning of the unconstrained clock schedule, (2) gradual improvement of this solution based on a limited search space that preserves the ordering of the unconstrained schedule and (3) final full search with temporary limitation removed. When artificially over-constraining the search during the first two phases, the solver converges significantly faster. Furthermore, many negative cycle and tightening constraints can be added for the final full search which in turn improves its run time.

Table 7 is an example pseudo code listing of an embodiment of the present invention that gives an overview of this refined process.

TABLE 7

REFINEDCONSTRAINEDSKEWSCHEDULING (G)

```
1   T_cycle = max{w(u,v) | (u,v) ∈ E_setup}
    // Phase 1: Use constraints from binning unconstrained schedule
2   T_cycle = INITIALSOLUTION (G,T_cycle)
    // Phase 2: Use constraints to preserve partial ordering of
    // unconstrained schedule
3   T_cycle = PARTIALORDERINGSOLUTION (G,T_cycle)
    // Phase 3: Full search
4   l,T_cycle = FULLSOLUTION (G,T_cycle)
5   return l,T_cycle =
```

TABLE 8

PARTIALORDERINGCONSTRAINTS $(G,\phi)$

```
1   l,T_cycle = UNCONSTRAINEDSKEWSCHEDULING (G)
2   foreach (u,v) ∈ E
3       if l(u) > l(v)
4           foreach d_i,d_j ∈ D, i < j
5               φ = ∪ {(x(u,d_i) ∨ x(v,d_j))}
```

An approach to derive a good initial value for $T_{cycle}$ is to solve the unconstrained clock skew scheduling problem for G using a process similar to that described in Table 1 and then distribute the resulting latencies greedily into $|D|$ bins of size $$\frac{l_{max} - l_{min}}{|D|},$$

where $l_{max}$ and $l_{min}$ represent the maximum and minimum latency of the unconstrained schedule, respectively. The actual clock period for this solution is computed by translating the latency binning into corresponding register-domain edges in G followed by single run of a process as described in Table 3.

Furthermore, the best solution for $|D|-1$ domains provides an upper bound for $T_{cycle}$ with $|D|$ domains. Since the process runs significantly faster for fewer clocking domains, a previously computed solution for fewer domains can be used as an alternative starting point if its value for $T_{cycle}$ is smaller than the one from binning.

After the initialization step, a set of partial ordering constraints are introduced on the domain assignments of registers. The partial ordering helps in trimming the search space, but may in turn also exclude the optimum solution. The heuristic assumes that if in the unconstrained skew schedule register u has a latency greater than that of register v, then there exists an optimum constrained skew schedule that has u assigned to a domain equal to or higher than v. The constraint generation for this heuristic is detailed in the example pseudo code listing of Table 8. The SAT-based search is then applied to this overconstrained problem. The resulting clock period is a good starting point for the final run of the solver to compute the exact optimum.

Figure 3:
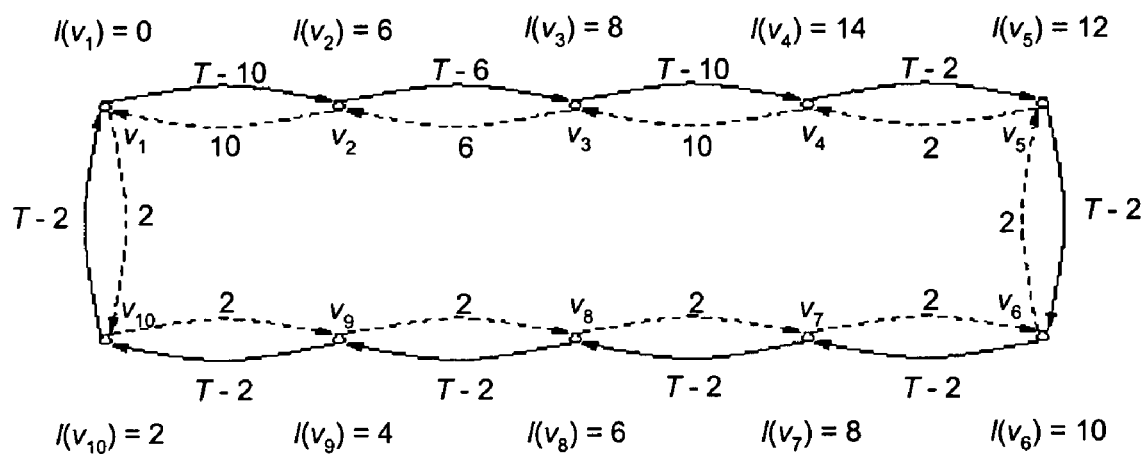
FIG. 3 is a timing graph of a counter example that illustrates an embodiment of the present invention.

The partial ordering heuristic appears to be exact for small circuits; however, one can show that the ordering constraints may exclude better solutions as illustrated by a counter-example given in FIG. 3. For this graph, the optimum $T_{cycle}$ is 4 for the unconstrained case. The latencies at each vertex to achieve this period are shown in the figure. Note that the constrained version of the problem will require at least 8 clocking domains to achieve this period.

Let $d_v$ denote the domain that vertex v is assigned to. Allowing only two clocking domains and zero within-domain latency (i.e., $\delta=0$), the path from $v_1$ to $v_4$ restricts the optimal period achievable with two domains to 8. The phase shifts of the individual domains are $l(d_1)=0$ and $l(d_2)=2$. The domain assignments of the individual vertices are $d_{v_1}=d_{v_3}=d_1$ and $d_{v_2}=d_{v_4}=d_2$, with the remaining vertices assigned to either domain.

To preserve the latency ordering of the unconstrained schedule, the partial ordering heuristic requires the constraints $d_{v_1} \leq d_{v_2} \leq d_{v_3} \leq d_{v_4}$. However, the constraint $d_{v_2} \leq d_{v_3}$ clearly violates all optimal domain-register assignments. The application of partial ordering constraints results in a period of 10, which is sub-optimal.

The present invention, in an embodiment following the pseudo code processes described herein was created in a prototype implementation for evaluation. A benchmark suite of the 31 ISCAS89 sequential circuits and 8 industrial designs. The ISCAS benchmarks were technology mapped through SIS using the library lib2.genlib. The industrial circuits were generated by a commercial logic synthesis tool using industrial ASIC libraries. The process of Table 7 was applied to determine the minimum feasible clock period with up to four clocking domains and a within-domain latency of up to 10% of the initial cycle period corresponding to the longest combinational delay including setup time. The experiments were conducted on a Pentium III 2 GHz processor with 2 GB RAM running Linux. The results are reported in the tables provided in FIGS. 4A and 4B. Table 4C presents the run times and the number of SAT solver iterations for the industrial circuits.

Columns 2 and 3 in Tables 4A and 4B give the number of vertices and edges in the timing graph. Column 4 reports the optimal clock period $T_{cycle}^{\infty}$ achievable through clock skew scheduling with an unconstrained number of domains. This is a lower bound. Column 5 shows the initial cycle time for the circuit corresponding to a zero skew schedule which is simply the longest combinational path delay. This is an upper bound and corresponds to a configuration with one domain and zero within-domain latency, denoted as $T_{cycle}^{1,0}$. The subsequent columns report the optimum clock period computed by our algorithm for a bounded number of domains and within-domain latency of 0%, 5%, and 10% of $T_{cycle}^{1,0}$. The numbers reported in a column with a label of $T_{cycle}^{x,y}$ indicate the optimum cycle time for x clock domains and a within-domain latency of $\delta = y\% \cdot T_{cycle}^{1,0}$. All dominating solutions are highlighted, i.e., the non-bold entries reflect solutions for which there exist an equivalent or better one with fewer domains or a smaller value for the within-domain latency.

The process optimized all ISCAS benchmarks—for a majority of instances, the optimum was achieved with less than three domains. The total run time on the first 27 ISCAS benchmarks was less than a minute. The last four circuits took only slightly longer. The results reported in Table 10 indicate a considerable cycle time improvement in most of the industrial circuits. Even with two domains and a within-domain latency of $\delta=5\% \times T_{cycle}^{1,0}$, the industrial benchmarks achieved on average 90% of the optimum cycle time ($T_{\infty}$) possible. With three domains and $5\% \times T_{cyle}^{1,0}$ latency, these benchmarks come as close as 95% of the optimum solution. In fact, for six of the eight industrial benchmarks, the process achieved the lowest clock period possible through clock skew scheduling with four domains; four among these reached the optimum with three domains. The run times were reasonable, given the high complexity of the problem. For design D2, with four domains and no within-domain skew, the algorithm was terminated after 20 hours; it had achieved a cycle time of 15.89 as shown. A re-run of that case with a tight initial guess (from a previous run) and the algorithm terminated in 17 hours with the optimum cycle time, which for that case is 15.41.

Figure 5:
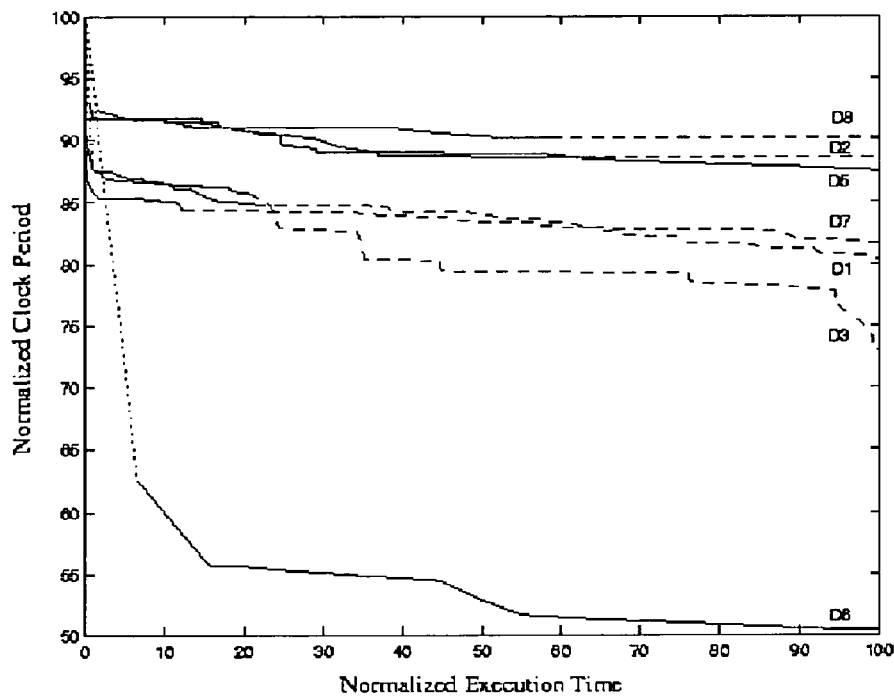
FIG. 5 is a graph that tracks results of the present invention.

FIG. 5 is a graph that tracks the progress of the three phases of the process over time for seven industrial designs constrained by four clocking domains and zero within-domain latency. Circuit D4 is not included. The execution time and clock period have been normalized: 100% corresponds to the clock period of the zero-skew schedule $T_{cycle}^{1,0}$. The curves are not a comparison of relative progress—rather, they capture the rate at which $T_{cycle}$ is improved. The three phases of the process of Table 7 are indicated by a dotted segment denoting the initial solution, a solid line representing phase 2 where partial ordering constraints are introduced and a dashed line denoting the last phase where a full search is performed. From the graph, it can be observed that the cycle times improve dramatically early in the algorithm. Hence, with limited CPU time, one can stop the algorithm shortly into phase 3 and still expect very good improvements in cycle time. Thus limited CPU time (e.g., execution time and/or CPU units) may be utilized until exhausted.

The present invention provides a process for constrained clock skew scheduling which computes for a fixed number of clocking domains the optimal phase shifts for the domains and the assignment of the individual registers to the domains. For the within domain latency values, the process can assume a zero-skew clock delivery or apply a user-provided upper bound. The process is based on a branch-and-bound enumeration of the register-to domain assignments. A CNF-based SAT solver is applied for the enumeration process and use learning of CNF constraints to prevent invalid register assignments and to record sets of inferior solutions which should not be revisited. The actual evaluation of each assignment is performed by an incremental maximum mean cycle analysis on the constraint graph.

Despite the potential complexity of the enumeration process, the present invention is efficient for modestly sized circuits and works even for circuits with several thousand registers reasonably fast. Furthermore, experimental results of the present invention show that a constrained clock skew schedule with few clocking domains and zero or 5% within-domain latency can in most cases achieve the optimal cycle time dictated by the critical cycle of the circuit. The resulting multi-domain solution provides a significant advantage over the corresponding unconstrained clock skew schedule which typically has large variations of register latencies.

In describing preferred embodiments of the present invention illustrated in the drawings, specific terminology is employed for the sake of clarity. However, the present invention is not intended to be limited to the specific terminology so selected, and it is to be understood that each specific element includes all technical equivalents which operate in a similar manner.

Portions of the present invention may be conveniently implemented using a conventional general purpose or a specialized digital computer or microprocessor programmed according to the teachings of the present disclosure.

Appropriate software coding can readily be prepared by programmers based on the teachings of the present disclosure, as will be apparent to those in the software art. The invention may also be implemented by the preparation of application specific integrated circuits or by interconnecting an appropriate network of conventional component circuits, as will be readily apparent to those in the relevant art based on the present disclosure.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMS, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, initializing constraints, branch and bound searches, detecting negative cycles, optimizing solutions, and the display, storage, or communication of results according to the processes of the present invention.

Experimental results shown in the figures and discussed herein were derived under the specific conditions noted. It should be apparent that the invention is not limited to the specific results shown, as any particular embodiment of the processes and/or methods of the present invention may take many different forms each capable of solving the problem at hand. And, each different embodiment would be expected to have its own unique results within an acceptable range of solutions for the problem at hand.

Obviously, numerous modifications and variations of the present invention are possible in light of the above teachings. It is therefore to be understood that within the scope of the appended claims, the invention may be practiced otherwise than as specifically described herein.

What is claimed is:

1. A method for sequential circuit design having a set of registers clocked by multiple clocking domains, comprising the steps of:

setting up a multi-domain clock skew scheduling problem for the circuit design, comprising a circuit clock period $T_{cycle}$, a latency value for each register, an assignment of each register to one clocking domain, and the phase shift values for each clocking domain; and solving the multi-domain clock skew scheduling problem to determine a solution.

2. The method according to claim 1, further comprising the steps of:

improving the solution using an optimization; and iteratively repeating said steps of solving and improving.

3. The method according to claim 2, wherein said step of iteratively repeating is done until a best solution for the multi-domain clock skew scheduling problem is determined.

4. The method according to claim 2, wherein said step of iteratively repeating is done until resources of a system performing said step are exhausted.

5. The method according to claim 4, wherein said resources comprise an allotment of at least one of execution time and CPU units.

6. The method according to claim 2, wherein said resources comprise an allotment of memory space.

7. The method according to claim 2, wherein the step of solving comprises the steps of:

enumerating register to domain assignments; and analyzing each of the assignments for validity with respect to a timing graph.

8. The method according to claim 7, wherein said step of enumerating comprises performing a branch and bound search to enumerate the register to domain assignments.

9. The method according to claim 8, wherein the register to domain assignments are encoded in conjunctive normal form and a Satisfiability (SAT) solver is used for performing the branch and bound search.

10. The method according to claim 7, wherein said step of analyzing comprises implementing a fast adaptation of Burns' optimization to determine validity and if improvement is possible.

11. The method according to claim 2, further comprising the step of detecting a negative cycle in the solution, and, if the negative cycle does not exist, then performing the improving step.

12. The method according to claim 1, wherein the circuit to be optimized is embedded in another type of circuit.

13. The method according to claim 12, wherein said another type of circuit comprises at least one of an asynchronous circuit, an analog circuit, and a memory type circuit.

14. The method according to claim 1, further comprising the step of utilizing the solution of the multi-domain clock skew scheduling problem as an upper bound for a subsequent solution of $T_{cycle}$ for the same multi-domain clock skew scheduling problem having additional domains.

15. The method according to claim 14, wherein the subsequent solution is for a multi-domain clock skew scheduling problem having one more domain than the previously solved multi-domain clock skew scheduling problem.

16. The method according to claim 1, further comprising the steps of:
increasing the number of domains; and
utilizing the solution of the multi-domain clock skew scheduling problem as an upper bound for a subsequent solution.

17. The method according to claim 1, further comprising the steps of:
constraining the multi-domain clock skew scheduling problem to a set of valid register to domain assignments;
improving the solution; and
iteratively repeating said steps of constraining, solving, and improving.

18. The method according to claim 17, wherein:
during each iteration, said step of constraining comprises the step of tightening constraints from a previous iteration.

19. The method according to claim 18, wherein:
the solution space of the multi-domain clock skew scheduling problem is encoded in conjunctive normal form (CNF); and
said step of tightening constraints comprises adding new constraints to the CNF formula that encode invalid or inferior register to domain assignments.

20. The method according to claim 18, wherein said step of tightening constraints comprises ensuring that no configurations with previously encountered cycles is revisited.

21. The method according to claim 1, further comprising the step of adding constraints related to non-timing considerations to the solution.

22. The method according to claim 21, wherein said non-timing considerations comprise at least one of physical placement, power, register locations, and routing.

23. The method according to claim 1, wherein:
said method is embodied in a set of computer instructions stored on a computer readable media;
said computer instructions, when loaded into a computer, cause the computer to perform the steps of said method.

24. The method according to claim 23, wherein said computer instructions are compiled computer instructions stored as an executable program on said computer readable media.

25. The method according to claim 1, wherein said method is embodied in a set of computer readable instructions stored in a computer readable medium.

26. A method, comprising the steps of:
providing a logic design for an integrated circuit; and
determining a multi-domain clock skew schedule problem for the logic design; and
solving the multi-domain clock skew scheduling problem for phase shifts and register assignments for each domain.

27. The method according to claim 26, wherein the step of providing said logic design comprises providing at least one of logic optimization and layout synthesis.

28. The method according to claim 26, wherein the multi-domain clock skew scheduling problem is determined, at least in part, by using timing information from the logic design.

29. The method according to claim 26, further comprising the step of implementing each clocking domain in an IC device.

30. The method according to claim 29, wherein the clocking domains are implemented using one of structured clock buffers, PLL circuitry, and tapping points of shift register coupled to a high frequency clock.

31. A circuit design tool, comprising:
a series of variables configured to accept assignment of properties of a circuit, the properties including register assignments for clocking domains within the circuit, phase shift of the clocking domains, and latency for each register;
setting up the variables to represent a multi-domain clock skew scheduling problem representative of an existing circuit design;
an initialization device configured to set initial values of the variables, including initial register assignment variables that represent valid register-to-domain assignments;
a solver configured to determine a valid $T_{cycle}$ solution to the multi-domain clock skew scheduling problem represented by the variables at a specified phase; and
an improvement mechanism configured to optimize the $T_{cycle}$ solution.

32. The circuit design tool according to claim 31, wherein within domain latency is computed using a useful skew algorithm.

33. The circuit design tool according to claim 32, wherein the within domain latency is limited according to constraints of a chip to be implemented.

34. The circuit design tool according to claim 31, further comprising an input mechanism configured to retrieve an upper bound on $T_{cycle}$.

35. The circuit design tool according to claim 31, wherein the initialization device comprises a branch and bound search mechanism to determine the assignment of registers to clocking domains.

36. The circuit design tool according to claim 31, wherein the problem is encoded in Conjunctive Normal Form (CNF).

37. The circuit design tool according to claim 36, wherein the initialization device sets the variables to valid register to domain assignments for optimization of the clocking domain problem.

38. The circuit design tool according to claim 31, further comprising a clocking domain input device configured to retrieve a user specified number of clocking domains for the circuit.

* * * * *